US008889245B2

(12) United States Patent  (10) Patent No.: US 8,889,245 B2
Jung et al.  (45) Date of Patent: Nov. 18, 2014

(54) THREE-DIMENSIONAL NANOSTRUCTURES AND METHOD FOR FABRICATING THE SAME

(75) Inventors: Hee-Tae Jung, Daejeon (KR); Hwan-Jin Jeon, Daejeon (KR); Kyoung-Hwan Kim, Daejeon (KR); Youn-Kyoung Baek, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 826 days.

(21) Appl. No.: 13/081,276

(22) Filed: Apr. 6, 2011

(65) Prior Publication Data

US 2011/0318535 A1  Dec. 29, 2011

(30) Foreign Application Priority Data

Jun. 29, 2010  (KR) .................. 10-2010-0062183

(51) Int. Cl.
| | |
|---|---|
| *B32B 3/00* | (2006.01) |
| *B82Y 40/00* | (2011.01) |
| *C03C 17/00* | (2006.01) |
| *B82Y 30/00* | (2011.01) |
| *G03F 7/00* | (2006.01) |
| *B81C 1/00* | (2006.01) |

(52) U.S. Cl.
CPC ............... *C03C 17/006* (2013.01); *B82Y 40/00* (2013.01); *C03C 2218/34* (2013.01); *B82Y 30/00* (2013.01); *G03F 7/0002* (2013.01); *C03C 2217/42* (2013.01); *G03F 7/0037* (2013.01); *B81C 1/00031* (2013.01)
USPC ......................................... 428/156; 428/172

(58) Field of Classification Search
CPC .............. B32B 3/00; B32B 3/30; B82Y 40/00
USPC ........... 428/156, 167, 172; 977/887, 888, 889
See application file for complete search history.

(56) References Cited

U.S. PATENT DOCUMENTS

2008/0121610 A1\* 5/2008 Nagata et al. ................... 216/11

OTHER PUBLICATIONS

Jeon et al., "The nobel nano-patterning technology for high resolution pattern (sub 20nm) by secondary sputtering phenomenon over large area", The Polymer Society of Korea, 2010, 3PS-216, vol. 35, No. 1.

\* cited by examiner

*Primary Examiner* — Catherine A Simone
(74) *Attorney, Agent, or Firm* — Rabin & Berdo, P.C.

(57) ABSTRACT

A three-dimensional nanostructures and a method for fabricating the same, and more particularly to three-dimensional structures of various shapes having high aspect ratio and uniformity in large area and a method of fabricating the same by attaching a target material to the outer surface of patterned polymer structures using an ion bombardment phenomenon occurring during a physical ion etching process to form target material-polymer composite structures, and then removing the polymer from the target material-polymer structures. A three-dimensional nanostructures with high aspect ratio and uniformity can be fabricated by a simple process at low cost by using the ion bombardment phenomenon occurring during physical ion etching. Also, nanostructures of various shapes can be easily fabricated by controlling the pattern and shape of polymer structures. In addition, uniform fine nanostructures having a thickness of 10 nm or less can be formed in a large area.

4 Claims, 8 Drawing Sheets

(a)

(b)

(a)

(b)

THREE-DIMENSIONAL NANOSTRUCTURES AND METHOD FOR FABRICATING THE SAME

CROSS-REFERENCE TO RELATED APPLICATION

This application claims priority under 35 USC 119 to Korean Patent Application No. 10-2010-0062183 filed Jun. 29, 2010. The disclosure of which is expressly incorporated by reference herein in its entirety.

TECHNICAL FIELD

The present invention relates to three-dimensional nanostructures and a method for fabricating the same, and more particularly to three-dimensional structures of various shapes having high aspect ratio and uniformity in large area and a method of fabricating the same by attaching a target material to the outer surface of patterned polymer structures using an ion bombardment phenomenon occurring during a physical ion etching process to form target material-polymer composite structures, and then removing the polymer from the target material-polymer structures.

BACKGROUND ART

In recent years, with the tendency for increased integration and miniaturization of electronic devices, studies on nanostructured materials and fabrication methods thereof have been very actively conducted.

Particularly, it is thought that techniques for fabricating large-area nanopatterns of high resolution and high aspect ratio are necessary to achieve the high performance of future nano-devices, such as nanosized electronic devices, optical devices, bio-devices and energy devices. Also, nanoimprint, e-beam, dip-pen, block copolymer and soft lithography techniques have been studied to realize high-performance nanodevices.

The dip-pen, e-beam and scanning probe microscope (SPM) lithography techniques capable of showing the highest resolution have an advantage capable of fabricating high-resolution patterns on the order of tens of nanometers, but suffer from a disadvantage in that they have significantly slow processing speeds, because they involve scanning with a tip. In addition, these techniques have to use expensive equipment that limit the actual use of these techniques in research and production.

Also, the nanoimprint and soft lithography techniques capable of fabricating nanopatterns in large area within a relatively short process time have an advantage in that a pattern having the size of a mask mold can be repeatedly transferred to a large-area substrate, but suffer from limitations in that it is impossible to fabricate a pattern having a size smaller than that of the mask mold and in that it is very expensive to fabricate a mask of less than 100 nm. Moreover, in these lithography techniques, because a pattern is fabricated using a stamping or etching process, only the two-dimensional shape of the mask mold is transferred as it is, and thus it is impossible to fabricate a three-dimensional pattern. In addition, when nanostructured patterns of other sizes or shapes are to be fabricated, other mask molds should be fabricated.

Accordingly, the present inventors have made many efforts to solve the above-mentioned problems occurring in the prior art and, as a result, have found that three-dimensional nanostructures of various shapes having high aspect ratio and uniformity can be fabricated by attaching a target material to the outer surface of patterned polymer structures using an ion bombardment phenomenon occurring during an ion etching process to form target material-polymer composite structures, and then removing the polymer from the target material-polymer composite structures, thereby completing the present invention.

DISCLOSURE OF INVENTION

It is a main object of the present invention to provide three-dimensional nanostructures of various shapes having high aspect ratio and uniformity and a fabrication method thereof.

To achieve the above object, the present invention provides a method for fabricating three-dimensional nanostructures, the method including the steps of: (a) forming a target material layer and a polymer layer sequentially on a substrate; (b) performing a lithography process on the polymer layer to form patterned polymer structures; (c) ion-etching the target material layer to form target material-polymer composite structures including the ion-etched target material attached to the outer surface of the polymer structures; and (d) removing the polymer from the target material-polymer composite structures, thereby fabricating three-dimensional nanostructures. The present invention also provides three-dimensional nanostructures which are fabricated by said method and have a shape selected from the group consisting of a cylindrical shape, an inverse conical shape, a rectangular parallelepiped shape, a line shape, a "⊏" shape and a top shape.

The present invention also provides a method for fabricating three-dimensional nanostructures, the method including the steps of: (a) forming a polymer layer on a substrate, and patterning the formed polymer layer by a lithography process to form patterned polymer structures; (b) forming a target material layer on the substrate having the patterned polymer structures formed thereon; (c) ion-etching the target material layer to form target material-polymer composite structures including the ion-etched target material attached to the outer surface of the polymer structures; (d) removing the polymer from the target material-polymer composite structures, thereby fabricating a three-dimensional nanostructure. The present invention also provides three-dimensional nanostructures which are fabricated by said method and have a shape selected from the group consisting of a cylindrical shape, an inverse conical shape, a rectangular parallelepiped shape, a line shape, a "⊏" shape and a top shape.

BRIEF DESCRIPTION OF THE DRAWINGS

The above and other objects, features and advantages of the present invention will be more clearly understood from the following detailed description taken in conjunction with the accompanying drawing, in which.

BEST MODE FOR CARRYING OUT THE INVENTION

In one aspect, the present invention is directed to a method for fabricating three-dimensional nanostructures, the method including the steps of: (a) forming a target material layer and a polymer layer sequentially on a substrate; (b) performing a lithography process on the polymer layer to form patterned polymer structures; (c) ion-etching the target material layer to form target material-polymer composite structures including the ion-etched target material attached to the outer surface of the polymer structures; and (d) removing the polymer from the target material-polymer composite structures, thereby fabricating three-dimensional nanostructures.

The key idea of the present invention is to use an ion bombardment phenomenon in which particles of a physically bombarded target material are scattered in all directions. According to the present invention, three-dimensional nanostructures with high aspect ratio and uniformity are fabricated in large area by providing patterned polymer structures having an outer surface to which target material particles scattered from a target material layer can be attached, and then removing only the polymer from target material-polymer composite structures formed as a result of a process in which the particles scattered from the target material by the ion bombardment phenomenon are attached to polymer structures.

Figure 1:
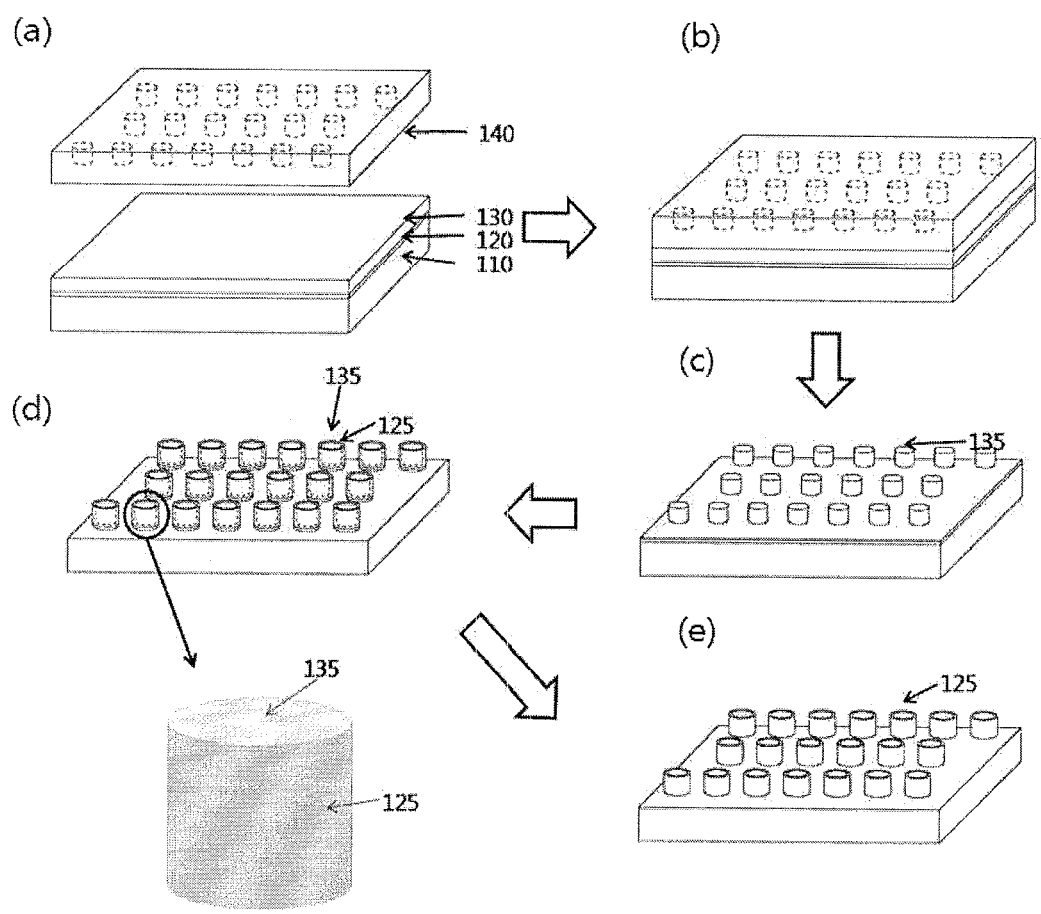
FIG. 1a-1e show a process for fabricating three-dimensional nanostructures according to one embodiment of the present invention.
Figure 2:
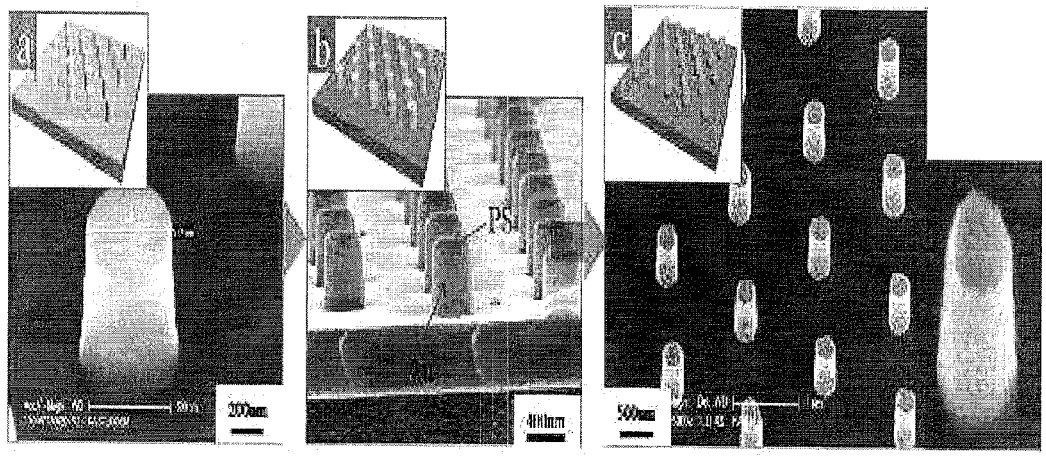
FIG. 2a-2c depict scanning electron micrographs of three-dimensional nanostructures fabricated according to one embodiment of the present invention.

FIG. 1 and FIG. 2 show a method for fabricating three-dimensional nanostructures according to the present invention. As shown therein, a target material and a polymer are sequentially applied to a substrate 110 to form a target material layer 120 and a polymer layer 130 on the substrate 110 (FIG. 1a).

The substrate 110 is a flat plate and may be made of any material that does not undergo physical deformation caused by the temperature and pressure of a lithography process. Preferably, the substrate 110 is made of a material selected from the group consisting of silicon, silicon oxide, quartz, glass, polymers, and mixtures thereof.

As used herein, the term "target material" means a material constituting the three-nanostructure nanostructures that are final products. The target material is a polycrystalline material which can be scattered in all directions by the ion bombardment phenomenon occurring during physical ion etching as described below. Preferably, the target material is selected from the group consisting of gold, platinum, silver, copper, aluminum, zinc oxide, chromium, silicon dioxide, indium tin oxide, and mixtures thereof.

The polymer that is used in the present invention may be any polymer that can be used in a lithography process. Preferably, the polymer is selected from the group consisting of polystyrene, chitosan, polyvinyl alcohol, polymethylmethacrylate (PMMA), and mixtures thereof.

In the present invention, in the process of forming the target material layer 120 and the polymer layer 130 sequentially on the substrate 110, the target material layer 120 is generally formed by a process selected from the group consisting of chemical vapor deposition (CVD), atomic layer deposition, sputtering, laser ablation, arc discharge, plasma deposition, thermal chemical vapor deposition and e-beam evaporation processes, and the polymer layer 130 is formed by spin coating or spray coating.

In the present invention, the target material layer 120 may be formed to have a multilayer structure depending on the intended use or the like of the three-dimensional nanostructures that are final products.

The polymer layer 130 formed on the target material layer 120 as described above is patterned by a lithography process (FIG. 1b) using a nanoimprint mold 140, thereby forming patterned polymer structures 135 (FIGS. 1c and 2a). Because the shape of the formed polymer structures 135 determines the shape of three-dimensional nanostructures to be fabricated, three-dimensional nanostructures 200 of various shapes can be easily fabricated by controlling the shape of the polymer structures 135 using various lithography processes.

The lithography process that is used in the present invention may be a conventional lithography process. Preferably, it is carried out by at least one process selected from the group consisting of nanoimprint lithography, soft lithography, block copolymer lithography, photolithography and capillary lithography.

In the present invention, target material-polymer composite structures 150 are formed by attaching particles of a target material 125 to the outer surface of the polymer structures 135, formed as described above, using an ion bombardment phenomenon occurring during physical ion etching of the target material (FIGS. 1d and 2b).

Figure 3:
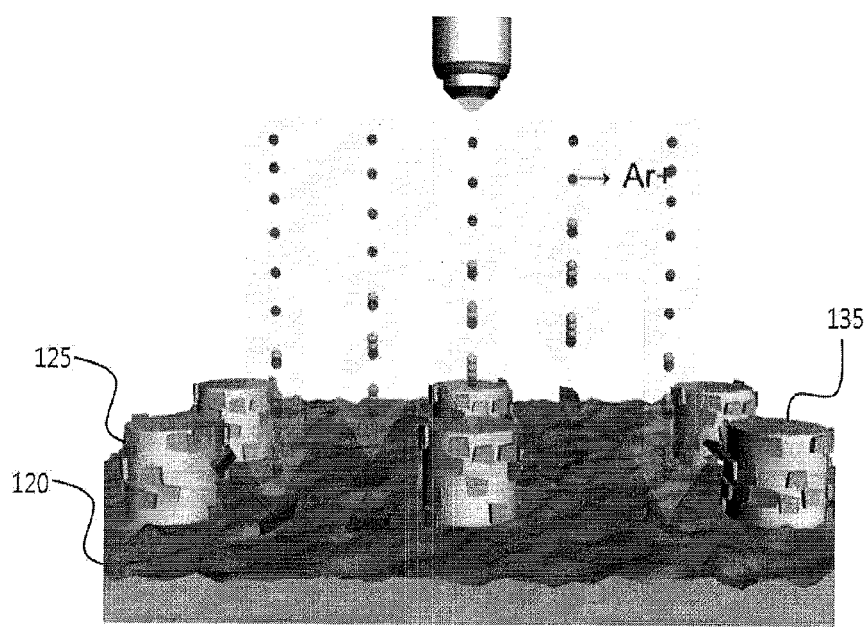
FIG. 3 is a schematic view showing an ion etching process according to the present invention.

As shown in FIG. 3, the ion bombardment phenomenon refers to a phenomenon in which, when ions (e.g., argon ions) accelerated by a voltage difference are physically bombarded onto the target material layer 120, particles of the bombarded target material 125 are scattered in the crystal direction due to high-energy bombardment.

In the present invention, as a physical ion etching process for creating the ion bombardment phenomenon, ion milling is carried out.

Where the ion bombardment phenomenon is created by applying high energy to small ions, the wide angle distribution of the polycrystalline orientation becomes narrower to reduce the angle at which the particles are scattered, thus making it difficult to attach the particles of the target material 125 to the outer surface of the patterned polymer structures 135. For this reason, the physical ion etching process is preferably carried out by forming plasma using a heavy gas such as argon under a process pressure of 0.1-10 mTorr, and then accelerating the plasma in the range of 200-1,000 eV.

In the physical etching process, if ion etching is carried out using plasma accelerated to more than 1,000 eV, particles will be scattered from the target material layer in the vertical direction equal to the ion incidence direction, and thus the amount of particles attached to the outer surface of the polymer structures will be small. On the other hand, if ion etching is carried out using plasma accelerated in the range of less than 200 eV, the etching rate of the target material layer will be low, and thus the operating efficiency will be low.

In the present invention, the heavy gas is selected from the group consisting of argon, helium, nitrogen, hydrogen, oxygen, and mixtures thereof. Preferably, it is argon.

The target material-polymer composite structures 150 formed as described above are dry-etched or wet-etched to remove the polymer 135, thereby fabricating three-dimensional nanostructures 200 (FIGS. 1e and 2c). The dry etching or wet etching is carried out by a conventional etching process capable of removing the polymer.

In the method for fabricating three-dimensional nanostructures according to the present invention, only desired patterned three-dimensional nanostructures can be fabricated by fabricating the three-dimensional nanostructures 200, and then removing an unnecessary target material portion from the fabricated three-dimensional nanostructures 200 by ion etching.

In the method for fabricating three-dimensional nanostructures according to the present invention, there-dimensional nanostructures with high aspect ratio and uniformity can be fabricated in large area by a simple process at low cost by using the ion bombardment phenomenon occurring during physical ion etching. Also, various structures can be easily fabricated by controlling the pattern of the polymer structures, and uniform fine nanostructures having a thickness of 10 nm or less can be formed in a large area.

In another aspect, the present invention is also directed to three-dimensional nanostructures which are fabricated by said method and have a shape selected from the group consisting of a cylindrical shape, an inverse conical shape, a rectangular parallelepiped shape, a line shape, a "⊏" shape and a top shape. The three-dimensional nanostructures contain a polycrystalline material in which the ion bombardment phenomenon occurs well and have an aspect ratio of 50 or less.

According to the present invention, three-dimensional nanostructures having a high height of 500 nm or more can be uniformly fabricated in a large area by ion-etching a target material layer having a small thickness ranging from 20 nm to 30 nm. Thus, the surface area of the three-dimensional nanostructures can be increased, and the height of the nanostructures can be easily controlled by additional etching, thus controlling the increase in the surface area. Also, because the three-dimensional nanostructures have high aspect ratio, they can be widely used in optical studies on patterns having high aspect ratio.

In another aspect, the present invention is directed to a method for fabricating three-dimensional nanostructures, the method including the steps of: (a) forming a polymer layer on a substrate, and patterning the formed polymer layer by a lithography process to form patterned polymer structures; (b) forming a target material layer on the substrate having the patterned polymer structures formed thereon; (c) ion-etching the target material layer to form target material-polymer composite structures including the ion-etched target material attached to the outer surface of the polymer structures; and (d) removing the polymer from the target material-polymer composite structures, thereby fabricating three-dimensional nanostructures.

Figure 4:
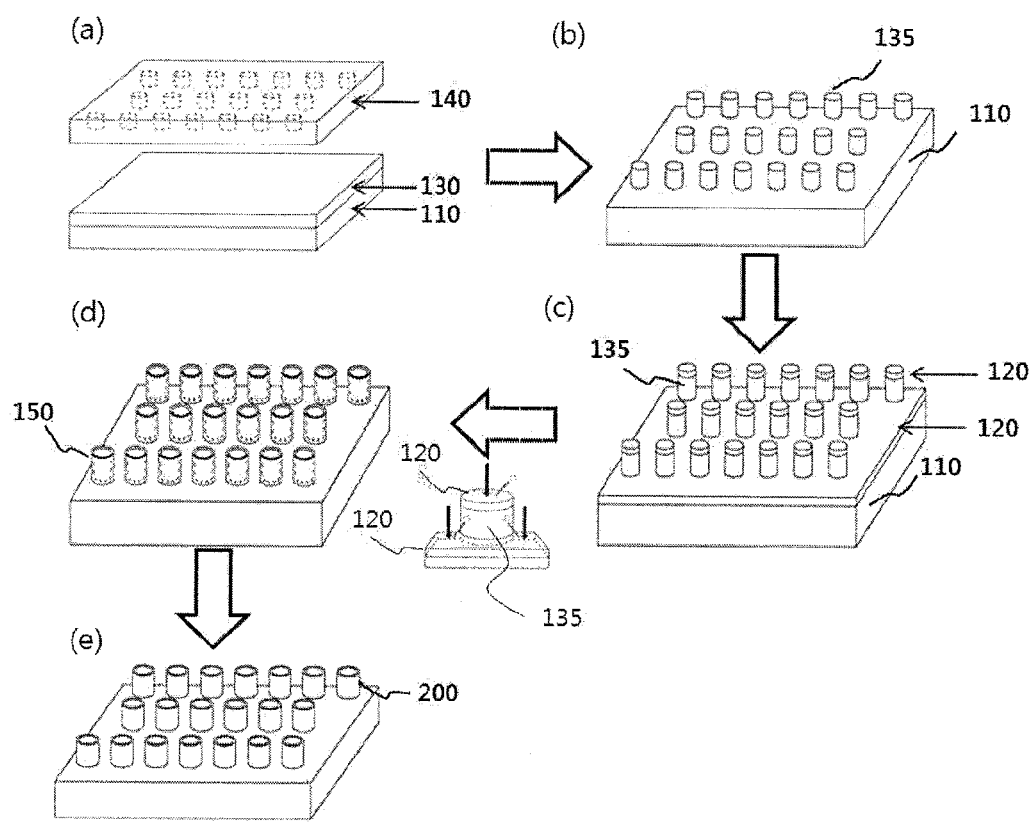
FIG. 4a-4e show a process for fabricating three-dimensional nanostructures according to another embodiment of the present invention.

As shown in FIG. 4, the method for manufacturing three-dimensional nanostructures according to the present invention comprises applying a polymer layer 130 to a substrate 110 (FIG. 4a), and then forming patterned polymer structures 135 by a lithography process (FIG. 4b). A target material layer 120 is formed on the substrate having the patterned polymer structures 135 formed thereon (FIG. 4c), and the formed target material layer 120 is physically ion-etched so that the target material particles are attached to the outer surface of the polymer structures 135 by the ion bombardment phenomenon, thereby forming target material-polymer structures 150 (FIG. 4d). Only the polymer 135 is removed from the formed target material-polymer structures 150, thereby fabricating three-dimensional nanostructures (FIG. 4e).

This fabrication method has a advantage in that a step of removing the target material 125 excluding the three-dimensional nanostructures 200 after fabricating the three-dimensional nanostructures 200 does not need to be carried out.

In still another aspect, the present invention is directed to polycrystalline material-containing three-dimensional nanostructures which are fabricated by said method and the shape of which is controlled according to the shape of the outer surface of the polymer structures and which have an aspect ratio of 25 or less.

The three-dimensional structures according to the present invention are fabricated using the ion bombardment phenomenon in which particles of the physically bombarded target material are scattered in all directions. Namely, the three-dimensional structures are fabricated by providing patterned polymer structures to which target material particles scattered by the ion bombardment phenomenon can be attached, and then removing the polymer to which the target material particles had been attached. Thus, the shape of the nanostructures can be easily controlled according to the shape of the outer surface of the polymer structures, and the nanostructures having high aspect ratio and uniformity are formed in a large area.

EXAMPLE

Hereinafter, the present invention will be described in further detail with reference to examples. It will be obvious to a person of ordinary skill in the art that these examples are illustrative purposes only and are not to be construed to limit the scope of the present invention.

Example 1

Fabrication of Three-Dimensional Nanostructures of Cylindrical Shape 1-1: Formation of Polymer Structures Gold was deposited on a glass substrate to a thickness of 15 nm by e-beam evaporation, and then a polystyrene (3 wt %)/toluene mixture was spin-coated thereon, after which the toluene was evaporated to form a polystyrene layer having a 135-nm thickness. The formed polystyrene layer was patterned using a nanoimprint mold having depressions of cylindrical shape at 135° C. in a vacuum under capillary force for 1 hour, whereby polystyrene patterns of cylindrical shape having an outer diameter of 500 nm, a height of 550 nm and an interval between polymer structures of 900 nm were formed in an area of 7 mm×7 mm. Then, the nanoimprint mold was detached, and the remaining structures were cooled, thereby forming patterned polystyrene structures. The polystyrene layer excluding the formed polystyrene structures was removed by reactive ion etching using a mixed gas of oxygen and tetrafluoromethane (40:60), whereby polystyrene structures having an outer diameter of 400 nm, a height of 500 nm and an interval between structures of 1000 nm were formed on the glass substrate (FIG. 2a).

1-2: Formation of Target Material-Polymer Composite Structures

The gold layer on which the patterned polystyrene structures had been formed as described in Example 1-1 above was ion-etched in an ion milling system (VTS Co., Ltd., Korea) using plasma, formed from argon gas, under a pressure of 0.1 mTorr at 500 eV, thereby forming gold-polystyrene composite structures including gold particles attached to the outer surface of the polystyrene structures (FIG. 2b).

1-3: Fabrication of Three-Dimensional Nanostructures

The gold-polystyrene composite structures formed in Example 1-2 above were reactive-ion etched under an oxygen atmosphere and sonicated in a dichoromethane solution to remove the polystyrene, thereby fabricating three-dimensional gold nanostructures of hollow cylindrical shape having an outer diameter of 400 nm, an inner diameter of 385 nm, a thickness of 15 nm and a height of 500 nm (FIG. 2c).

Example 2

Figure 5:
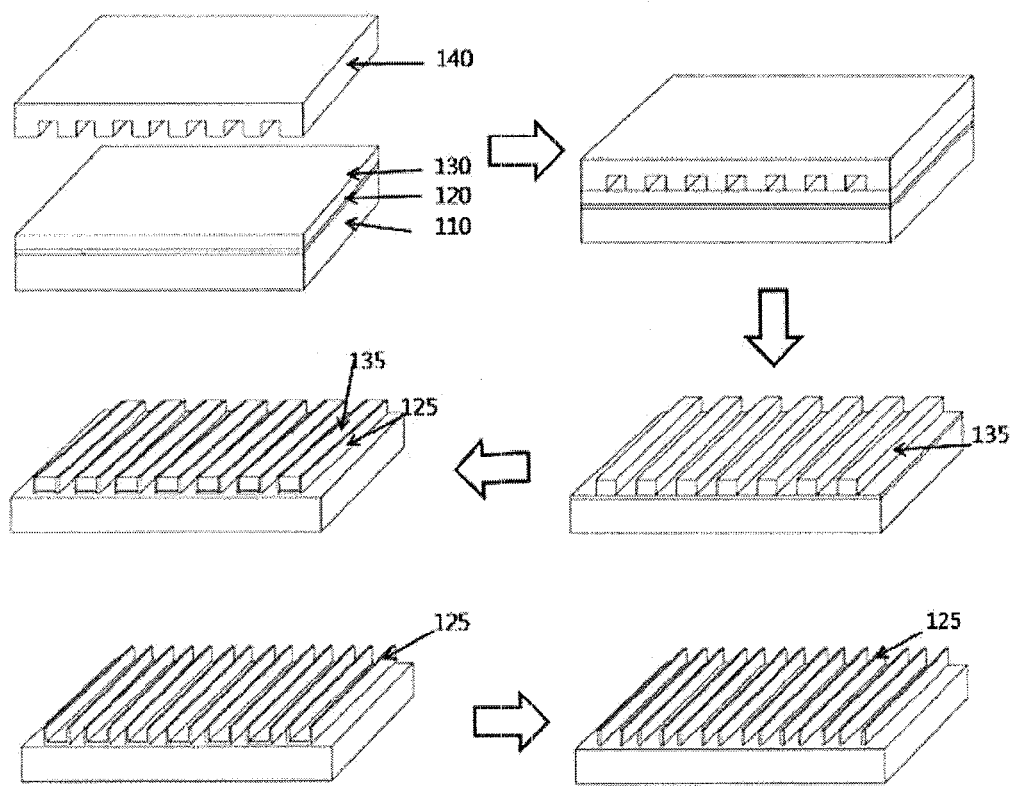
FIG. 5 shows a process for fabricating three-dimensional nanostructures of rectangular parallelepiped shape according to the present invention.
Figure 6:
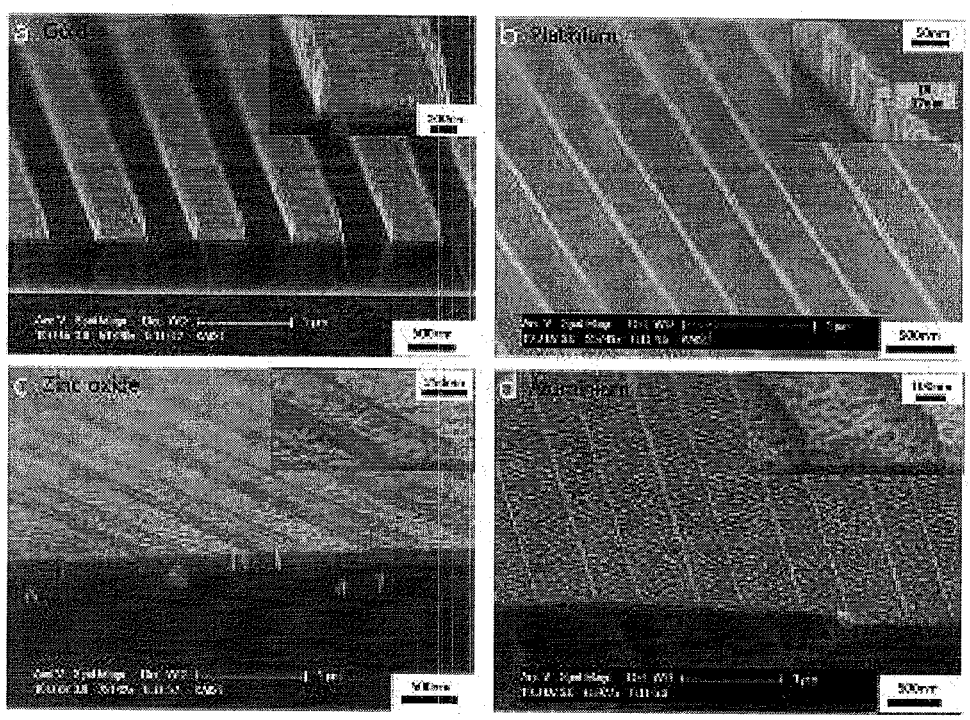
FIG. 6a-6d depict scanning electron micrographs of three-dimensional nanostructures of rectangular parallelepiped shape according to the present invention (a: three-dimensional gold nanostructures; b: three-dimensional platinum structures; c: three-dimensional zinc oxide nanostructures; and d: three-dimensional aluminum nanostructures)

Fabrication of Three-Dimensional Nanostructures of Rectangular Parallelepiped Shape/Line Shape According to the same method as described in Example 1, three-dimensional gold nanostructures of "⊏" shape having a size of 5 mm (length)×250 nm (height)×500 nm (width) and a thickness of 15 nm (FIG. 6a), three-dimensional platinum nanostructures of "⊏" shape having a size of 5 mm (length)× 150 nm (height)×500 nm (width) and a thickness of 15 nm (6b), three-dimensional zinc oxide nanostructures of "⊏" shape having a size of 5 mm (length)×85 nm (height)×500 nm (width) and a thickness of 15 nm, and three-dimensional nanostructures of "⊏" shape having a size of 5 mm (length)× 100 nm (height)×500 nm (width) and a thickness of 15 nm were fabricated using a nanoimprint mold, having depressions of rectangular parallelepiped shape as shown in FIG. 5, and using gold, platinum, zinc oxide or aluminum as a target material. In addition, the three-dimensional zinc oxide nanostructures and the three-dimensional aluminum nanostructures were further treated by ion milling, thereby fabricating three-dimensional zinc oxide nanostructures of line shape having a size of 5 mm (length)×85 nm (height)×500 nm (width) and a thickness of 15 nm (FIG. 6c), and three-dimensional aluminum nanostructures having a size of 5 mm (length)×100 nm (height)×500 nm (width) and a thickness of 15 nm (FIG. 6d).

Example 3

Fabrication of Three-Dimensional Nanostructures of Top Shape

According to the same method as described in Example 1, patterned polystyrene structures were formed using a nanoimprint mold having depressions of cylindrical shape as shown in FIG. 2. The lower portion of the patterned polystyrene structures was over-etched by reactive ion etching using a mixed gas of oxygen and tetrafluoromethane (40:60) under a low vacuum of 0.1 Torr, after which three-dimensional gold nanostructures of top shape were fabricated using the polystyrene structures (FIG. 7a).

Figure 7:
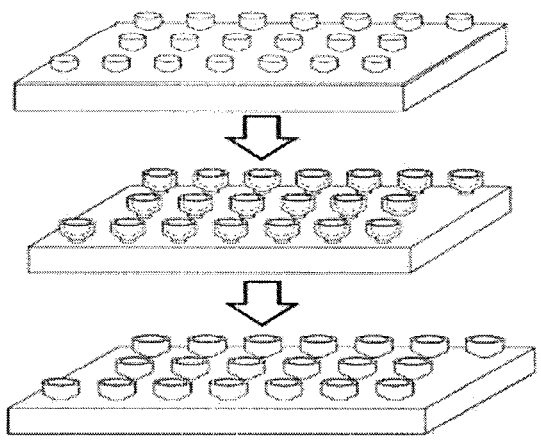
FIG. 7a-7b show a process for fabricating three-dimensional nanostructures of top shape according to the present invention (a) and a scanning electron micrograph of the three-dimensional nanostructures of top shape (b)
Figure 7:
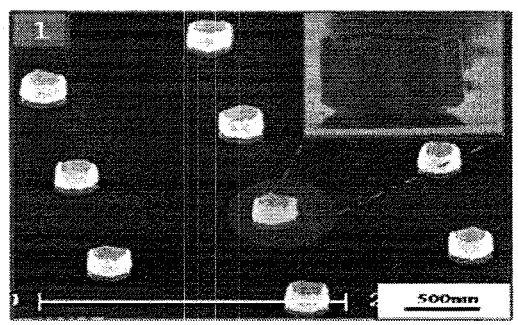

As a result, as can be seen in FIG. 7b, three-dimensional gold nanostructures of hollow top shape having a maximum outer diameter of 300 nm, a minimum outer diameter of 250 nm and a height of 200 nm were fabricated.

Example 4

Fabrication of Three-Dimensional Nanostructures of Inverse Conical Shape

Figure 8:
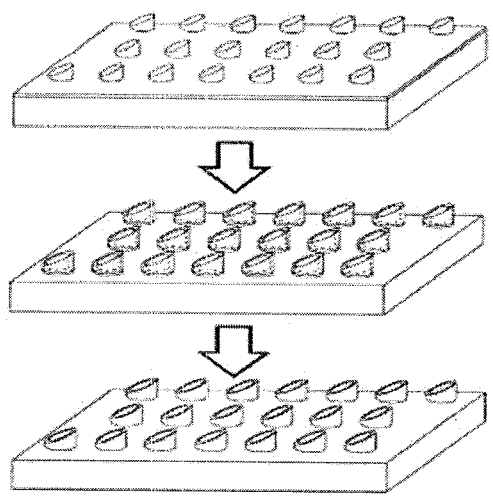
FIG. 8a-8b show a process for fabricating three-dimensional nanostructures of conical shape according to the present invention (a) and a scanning electron micrograph of the three-dimensional nanostructures of conical shape (b)
Figure 8:
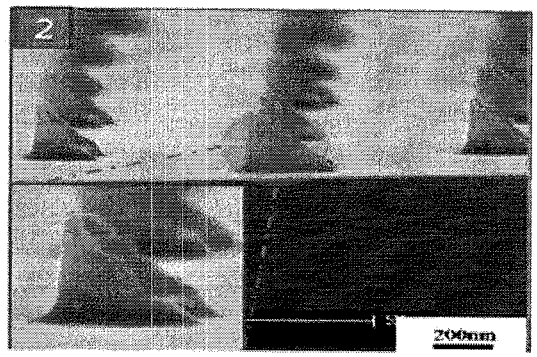

According to the same method as described in Example 1, patterned polystyrene structures were formed using a nanoimplant mold having depressions of inverse conical shape, after which three-dimensional gold nanostructures of hollow inverse conical shape were formed using the polystyrene structures (FIG. 8a).

As a result, as can be seen in FIG. 8b, three-dimensional gold nanostructures of hollow conical shape having an outer diameter of 250 nm and a height of 150 nm were fabricated.

Example 5

Fabrication of Nanostructures According to Another Embodiment 2-1: Formation of Polymer Structures A polystyrene/toluene mixture was spin-coated on a glass substrate, and then the toluene was evaporated, thus forming a polystyrene layer having a thickness of 135 nm. The formed polystyrene layer was patterned using a nanoimprint mold, having depressions of cylindrical shape, at 135° C. under capillary force for 1 hour in a vacuum. Then, the nanoimprint mold was detached, and the remaining structures were cooled, thereby forming patterned polystyrene structures.

2-2: Formation of Target Material-Polymer Composite Structures

On the glass substrate having the polystyrene structures formed thereon as described in Example 2-1 above, gold was deposited to a thickness of 15 nm by e-beam evaporation, thereby forming a gold layer on the polystyrene structures. The gold layer was ion-etched in an ion milling system (VTS Co., Ltd., USA) using plasma, formed from argon gas, under a pressure of 0.1 mTorr at 500 eV, thereby forming gold-polystyrene composite structures including gold particles attached to the outer surface of the polystyrene structures.

3-3: Fabrication of Three-Dimensional Nanostructures

The gold-polystyrene composite structures fabricated in Example 2-2 above were subjected to reactive ion etching under an oxygen atmosphere, and then sonicated in a dichloromethane solution to remove the polystyrene, thereby fabricating three-dimensional nanostructures of hollow cylindrical shape having an outer diameter of 400 nm, an inner diameter of 385 nm and a height of 500 nm.

Example 6

Fabrication of Nanostructures According to Another Embodiment

Figure 9:
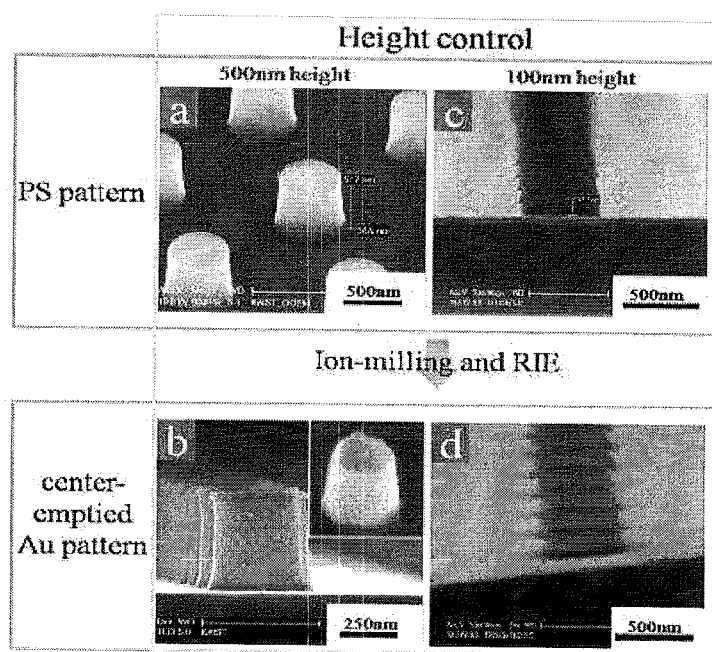
FIG. 9a-9d show scanning electron micrographs of three-dimensional nanostructures fabricated according to another embodiment of the present invention (a: PS structures having a 520-nm height; b: three-dimensional gold nanostructures having a 500-nm height; c: PS structures having a 120-nm height; and d: three-dimensional gold nanostructures having a 100-nm height).

According to the same method as described in Example 1, patterned polystyrene structures of cylindrical shape having a height of 500 nm were fabricated (FIG. 9a), after which three-dimensional gold nanostructures having a height of 500 nm were fabricated using the patterned polystyrene structures (FIG. 9b).

Also, the patterned polystyrene structures having a height of 500 nm (FIG. 9a) were reactive-ion-etched with a mixed gas of oxygen and tertrafluoromethane (40:60) under a high vacuum (0.001 Torr) for 2 minutes to form patterned polystyrene structures of cylindrical shape having a height of 100 nm (FIG. 9c), after which three-dimensional gold nanostructures having a height of 100 nm (FIG. 9d) were fabricated according to the same method as Example 1 using the patterned polystyrene structures.

As a result, it could be seen that the pattern height of the target material could be controlled by controlling the height of the polymer structures.

Although the present invention has been described in detail with reference to the specific features, it will be apparent to those skilled in the art that this description is only for a preferred embodiment and does not limit the scope of the present invention. Thus, the substantial scope of the present invention will be defined by the appended claims and equivalents thereof.

INDUSTRIAL APPLICABILITY

As described above, according to the method of the present invention, three-dimensional nanostructures with high aspect ratio and uniformity can be fabricated by a simple process at low cost by using the ion bombardment phenomenon occurring during physical ion etching. Also, nanostructures of various shapes can be easily fabricated by controlling the pattern and shape of polymer structures. In addition, uniform fine nanostructures having a thickness of 10 nm or less can be formed in a large area. Accordingly, the present invention can achieve the high performance of future nano-devices, such as nanosized electronic devices, optical devices, bio-devices and energy devices.

EXPLANATION ON REFERENCE NUMERALS OF MAIN ELEMENTS

- 110: substrate
- 120: target material layer
- 125: target material
- 130: polymer layer
- 135: polymer
- 140: nanoimprint mold
- 150: target material-polymer composite structures
- 200: three-dimensional nanostructures

The invention claimed is:

1. A three-dimensional nanostructures comprising a pattern of target material having a hollow shape selected from the group consisting of a cylindrical shape, an inverse conical shape, a rectangular parallelepiped shape, a top shape, a line shape and a "⊏" shape, and having an aspect ratio of 50 or less, wherein the three-dimensional nanostructures are fabricated by a method comprising:

(a) forming a target material layer and a polymer layer sequentially on a substrate; (b) performing a lithography process on the polymer layer to form patterned polymer structures; (c) ion-etching the target material layer to form target material-polymer composite structures including the ion-etched target material attached to the outer surface of the polymer structures; and (d) removing the polymer from the target material-polymer composite structures, thereby fabricating three-dimensional nanostructures.

2. The three-dimensional nanostructures according to claim 1, wherein the three-dimensional nanostructures contain a polycrystalline material.

3. A three-dimensional nanostructures comprising a pattern of target material having a hollow shape selected from the group consisting of a cylindrical shape, an inverse conical shape, a rectangular parallelepiped shape, a top shape, a line shape and a "⊏" shape, and having an aspect ratio of 50 or less, wherein the three-dimensional nanostructures are fabricated by a method comprising:

(a) forming a polymer layer on a substrate, and then performing a lithography process to form patterned polymer structures; (b) forming a target material layer on the substrate having the patterned polymer structures formed thereon; (c) ion-etching the target material layer to form target material-polymer composite structures including the ion-etched target material attached to the outer surface of the polymer structures; (d) removing the polymer from the target material-polymer composite structures, thereby fabricating a three-dimensional nanostructure.

4. The three-dimensional nanostructures according to claim 3, wherein the three-dimensional nanostructures contain a polycrystalline material.

* * * * *